United States Patent
Yi et al.

(10) Patent No.: US 9,443,599 B2
(45) Date of Patent: Sep. 13, 2016

(54) METHOD OF CONTROLLING ERASE OPERATION OF A MEMORY AND MEMORY SYSTEM IMPLEMENTING THE SAME

(71) Applicants: Hyun-Ju Yi, Hwaseong-Si (KR); Seok-Won Ahn, Suwon-Si (KR); Hwa-Seok Oh, Yongin-Si (KR)

(72) Inventors: Hyun-Ju Yi, Hwaseong-Si (KR); Seok-Won Ahn, Suwon-Si (KR); Hwa-Seok Oh, Yongin-Si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 0 days.

(21) Appl. No.: 14/679,046

(22) Filed: Apr. 6, 2015

(65) Prior Publication Data
US 2015/0287468 A1  Oct. 8, 2015

(30) Foreign Application Priority Data
Apr. 7, 2014 (KR) .................. 10-2014-0041499

(51) Int. Cl.
| G11C 16/04 | (2006.01) |
|---|---|
| G11C 16/16 | (2006.01) |
| G06F 13/16 | (2006.01) |
| G11C 16/32 | (2006.01) |

(52) U.S. Cl.
CPC ............. *G11C 16/16* (2013.01); *G06F 13/161* (2013.01); *G11C 16/32* (2013.01); *G11C 2216/20* (2013.01)

(58) Field of Classification Search
CPC ... G11C 16/14; G11C 16/0483; G11C 16/10; G11C 16/34; G11C 16/16; G11C 16/3436; G11C 16/3445; G11C 2207/2245; G11C 11/5635; G11C 16/3409; G11C 16/344; G11C 16/3459; G11C 16/32; G11C 16/3418

USPC .......... 365/185.11, 185.18, 185.29, 185.12, 365/185.17, 185.21, 189.16, 185.14, 185.02
See application file for complete search history.

(56) References Cited

U.S. PATENT DOCUMENTS

| 5,341,330 | A | 8/1994 | Wells et al. |
|---|---|---|---|
| 5,954,828 | A | 9/1999 | Lin |
| 7,562,180 | B2 | 7/2009 | Gyl et al. |
| 7,886,212 | B2 | 2/2011 | Lasser |
| 7,949,806 | B2 | 5/2011 | Jones et al. |
| 7,975,119 | B2 | 7/2011 | Erez |
| 8,117,380 | B2 | 2/2012 | Conley et al. |
| 8,117,414 | B2 | 2/2012 | Erez |
| 8,327,161 | B2 | 12/2012 | Cohen |
| 8,364,888 | B2 | 1/2013 | Melik-Martirosian et al. |
| 8,370,603 | B2 | 2/2013 | Toelkes et al. |
| 8,482,987 | B2 | 7/2013 | Yu et al. |
| 2011/0208896 | A1 | 8/2011 | Wakrat et al. |
| 2013/0198451 | A1 | 8/2013 | Hyun et al. |
| 2014/0063938 | A1* | 3/2014 | Oh .................. H01L 27/11524 365/185.02 |

FOREIGN PATENT DOCUMENTS

WO    2008029389 A1   3/2008

* cited by examiner

*Primary Examiner* — Thong Q Le
(74) *Attorney, Agent, or Firm* — Volentine & Whitt, PLLC (57) ABSTRACT

A non-volatile memory and a method of controlling an erase operation of the non-volatile memory using a controller are provided. The method of controlling the erase operation includes beginning performance of the erase operation, monitoring a next command to be performed in the non-volatile memory while performing the erase operation, determining an erase status, and continuing, suspending or canceling the erase operation based on the determination result of the erase status.

20 Claims, 9 Drawing Sheets

METHOD OF CONTROLLING ERASE OPERATION OF A MEMORY AND MEMORY SYSTEM IMPLEMENTING THE SAME

CROSS-REFERENCE TO RELATED APPLICATION

A claim for priority under 35 U.S.C. §119 is made to Korean Patent Application No. 10-2014-0041499, filed on Apr. 7, 2014, in the Korean Intellectual Property Office, the entire contents of which are hereby incorporated by reference.

BACKGROUND

Embodiments of the inventive concept relate to a method of controlling a memory and a memory system employing the same, and more particularly, to methods of controlling a memory to reduce a latency caused by erase operations of a non-volatile memory, and a memory system employing the same.

Among non-volatile memories, a NAND-type flash memory is mainly used as mass storage. To write data into memory cells of a flash memory, an erase operation is performed such that the memory cells have a predetermined negative threshold voltage. The erase operation is performed in units of memory blocks. Thereafter, a program (or write) operation is performed on a selected page connected to a selected memory cell, and a read operation is performed on the selected page. As compared with the write operation and the read operation, the erase operation takes a considerably longer time. A host may perform other commands after the flash memory finishes the erase operation. Accordingly, since the host cannot perform other operations due to latency caused by the erase operation of the flash memory, performance is degraded.

SUMMARY

Embodiments of the inventive concept provide a method of controlling a memory to reduce latency caused by an erase operation of a non-volatile memory, and a memory system employing the same.

According to an aspect of the inventive concept, there is provided a method of controlling an erase operation of a non-volatile memory using a controller. The method includes beginning performance of the erase operation, monitoring a next command to be performed in the non-volatile memory while performing the erase operation, determining an erase status, and continuing, suspending or canceling the erase operation based on the determination result of the erase status.

The method may further include completing the erase operation and executing the next command, based on the determination result; suspending the erase operation, executing the next command, and then resuming the erase operation, based on the determination result; or canceling the erase operation, executing the next command, and then re-starting the erase operation, based on the determination result.

The method may further include determining the number of a clock at a time point at which the erase operation starts, and counting a number of clock cycles during the performance of the erase operation. The erase status may be determined according to a step to which the counted number of clock cycles belongs among first through third steps of the erase operation. The first step may be set before a first time point of the erase operation, the second step may be set between the first time point and a second time point of the erase operation, and the third step may be set after the second time point. The first time point may correspond to a time point soon after the erase operation begins, and the second time point corresponds to a time point soon before the erase operation is completed.

The method may further include monitoring the next command stored in a command queue of the controller.

The erase operation may be performed in response to an erase command and/or the erase operation may be performed as a background operation for a merge operation, a garbage collection operation, or a refresh operation of the non-volatile memory.

The erase operation may be performed on multiple address units (MAUs), which are simultaneously erasable blocks among multiple memory blocks of the non-volatile memory.

According to another aspect of the inventive concept, there is provided a memory system including a non-volatile memory and a controller. The controller is configured to begin performing an erase operation on the non-volatile memory, to monitor a next command to be performed in the non-volatile memory while performing the erase operation, to determine an erase status, and to selectively continue, suspend or cancel the erase operation based on the determination result.

The controller may determine a number of a clock at a time point at which the erase operation starts, count a number of clock cycles during the erase operation, and determine the erase status according to a step to which the counted number of clock cycles belongs among first through third steps of the erase operation. The first step may be set prior to a first time point of the erase operation, the second step may be set between the first time point and a second time point, and the third step may be set after the second time point. The first time point may correspond to a time point soon after the erase operation begins, and the second time point may correspond to a time point soon before the erase operation is completed.

The controller may be configured to perform the erase operation in response to an erase command. Or, the controller may be configured to perform the erase operation in response to an erase command and as a background operation for a merge operation, a garbage collection operation, or a refresh operation of the non-volatile memory.

The non-volatile memory may perform the erase operation on MAUs, which are simultaneously erasable blocks among multiple memory blocks.

According to another aspect of the inventive concept, there is provided a memory system including a data storage unit and a controller. The data storage unit includes multiple sets of flash memories, each set of flash memories being connected to a channel of multiple channels corresponding to the sets of flash memories. The controller is configured to begin performing an erase operation on at least one flash memory of one set of flash memories via a corresponding channel, to monitor a next command to be performed in the at least one flash memory while performing the erase operation, to determine an erase status, and to continue, suspend or cancel the erase operation based on the determined erase status.

The controller may begin performing the erase operation on a MAU, which includes simultaneously erasable blocks from among the at least one flash memory of the set of flash memories. The MAU may be one of a single die or a single plane of a single die having multiple planes.

The controller may include a flash memory interface connected to the sets of flash memories via the channels, respectively, for enabling communication between the controller and the plurality of sets of flash memories, and a host interface for enabling communication between the controller and a host.

BRIEF DESCRIPTION OF THE DRAWINGS

Exemplary embodiments of the inventive concept will be more clearly understood from the following description taken in conjunction with the accompanying drawings, in which.

DETAILED DESCRIPTION OF THE EMBODIMENTS

The attached drawings for illustrating exemplary embodiments of the present inventive concept are referred to in order to gain a sufficient understanding of the present inventive concept, the merits thereof, and the objectives accomplished by the implementation of the present inventive concept.

Embodiments will be described in detail with reference to the following description and accompanying drawings. The inventive concept, however, may be embodied in various different forms, and should not be construed as being limited only to the illustrated embodiments. There is no intent to limit the inventive concept to the particular forms disclosed. Rather, these embodiments are provided as examples so that this disclosure will be thorough and complete, and will fully convey the concept of the inventive concept to one of ordinary skill in the art. Accordingly, known processes, elements, and techniques are not described with respect to some of the embodiments. Unless otherwise noted, like reference numerals denote like elements throughout the attached drawings and written description, and thus descriptions may not be repeated. In the drawings, thicknesses, sizes and relative sizes of layers and regions may be exaggerated for clarity.

The terminology used herein is for the purpose of describing particular embodiments only and is not intended to be limiting of example embodiments. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. The term "exemplary" is intended to refer to an example or illustration.

Semiconductor memory devices may be classified as volatile memory devices, such as dynamic random access memory (DRAM) and static random access memory (SRAM), and non-volatile memory devices, such as electrically erasable and programmable read-only memory (EEPRM), ferroelectric RAM (FRAM), phase-change RAM (PRAM), magnetic RAM (MRAM), and flash memory. A volatile memory device loses stored data when power supply is interrupted, while a non-volatile memory device may retain stored data even when power supply is interrupted. Flash memory, in particular, has merits, such as a high programming rate, low power consumption, and storage of mass data, and therefore flash memory has been used broadly as a storage medium in computer systems. Also, consumer electronic devices, such as a portable media player, may include flash memories to store music, video, and other media.

Figure 1:
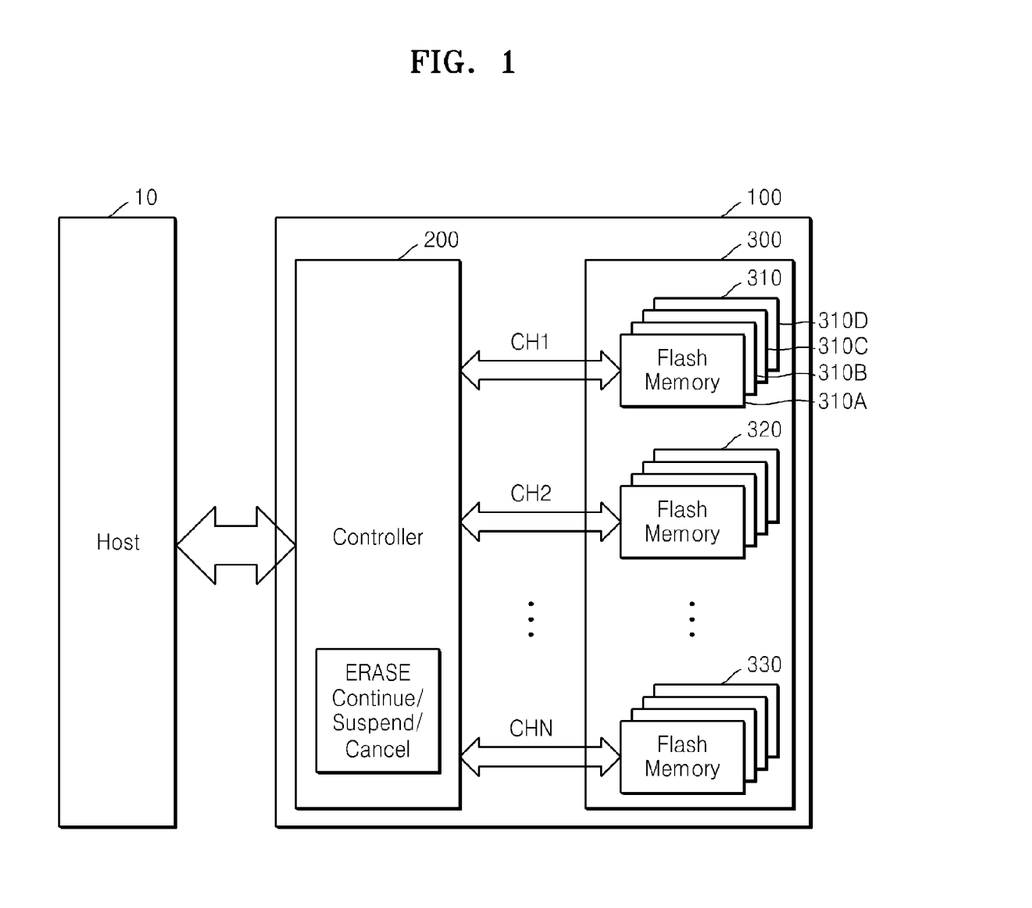
FIG. 1 is a block diagram of a memory system for implementing a method of controlling a flash memory, according to embodiments of the inventive concept.

FIG. 1 is a block diagram of a memory system 100 for implementing methods of controlling a flash memory according to embodiments of the inventive concept.

Referring to FIG. 1, the memory system 100 includes a controller 200 and a data storage unit 300. The data storage unit 300 includes non-volatile memories, such as exemplary flash memories 310 to 330. The controller 200 is configured to control the data storage unit 300.

At least one channel, for example, N channels CH1 to CHN, may be provided between the controller 200 and the data storage unit 300. Multiple flash memories 310 to 330 may be electrically connected to the respective channels CH1 to CHN. For example, flash memories 310A to 310D may be connected to one channel CH1, and each of the flash memories 310A to 310D may comprise multiple destinations.

Each of the channels CH1 to CHN may refer to an independent bus configured to transmit commands and data to the corresponding one of the flash memories 310 to 330. The respective flash memories 310 to 330 connected to different channels may operate independently. A destination may refer to a set of flash memories among which a single flash channel is shared. Each flash memory chip may be discriminated according to a channel and a destination corresponding thereto. It may be determined, based on a logical address transmitted from a host 10, to which destination or channel a flash memory chip, in which a command transmitted from the host 10 will be performed, belongs.

An example in which the data storage unit 300 includes flash memories will be described below. A non-volatile memory applicable to the data storage unit 300 is not limited to a specific kind and a specific form, and may be provided in various forms.

The number of data bits stored in each of memory cells of the flash memories 310 to 330 may be provided in various forms. For example, the flash memories 310 to 330 may include single-bit cells or single-level cells (SLCs) so that 1-bit data can be stored in a single memory cell. Or, the flash memories 310 to 330 may include multi-bit cells, multi-level cells (MLCs), or multi-state cells so that multi-bit data (e.g., 2 bits or more) can be stored in a single memory cell. The multi-bit cells may increase integration density. In the flash memories 310 to 330, a structure of a charge storage layer of a memory cell may be provided in various forms. For instance, a charge storage layer of a flash memory cell may be formed using a conductive material, such as polycrystalline silicon (poly-Si), or an insulating material, such as $Si_3N_4$, $Al_2O_3$, HfAlO, or HfSiO.

The controller 200 may exchange data with the host 10 through one of various interfaces, such as a universal serial bus (USB), multimedia card (MMC), peripheral component interface-express (PCI-E), advanced technology attachment (ATA), serial-ATA (SATA), parallel-ATA (PATA), serial attached small computer system (SAS), small computer system interface (SCSI), embedded multimedia card (eMMC), and enhanced small device interface (ESDI). The interfacing between the controller 200 and the host 10 may be performed in a host interface (refer to 240 in FIG. 2) included in the controller 200.

The controller 200 is configured to control erase, write, and/or read operations of the flash memories 310 to 330 in response to commands input from the host 10. The controller 200 enables an erase operation of the flash memories 310 to 330. The erase operation may be enabled in response to an erase command input from the host 10, or as a background operation for a merge operation, a garbage collection operation, or a refresh operation of the flash memories 310 to 330, for example. The controller 200 monitors the next command to be performed in the flash memories 310 to 330, where the next command may be stored in a command queue, for example. The next command refers to the command that follows receipt of the erase command. The controller 200 determines an erase status of the erase operation. For example, the controller 200 may count the number of clocks occurring from a time point at which the erase operation starts, and determine the erase status based on the amount of time that has elapsed. The controller 200 may selectively continue, suspend, or cancel the erase operation based on the erase status determination result.

Figure 2:
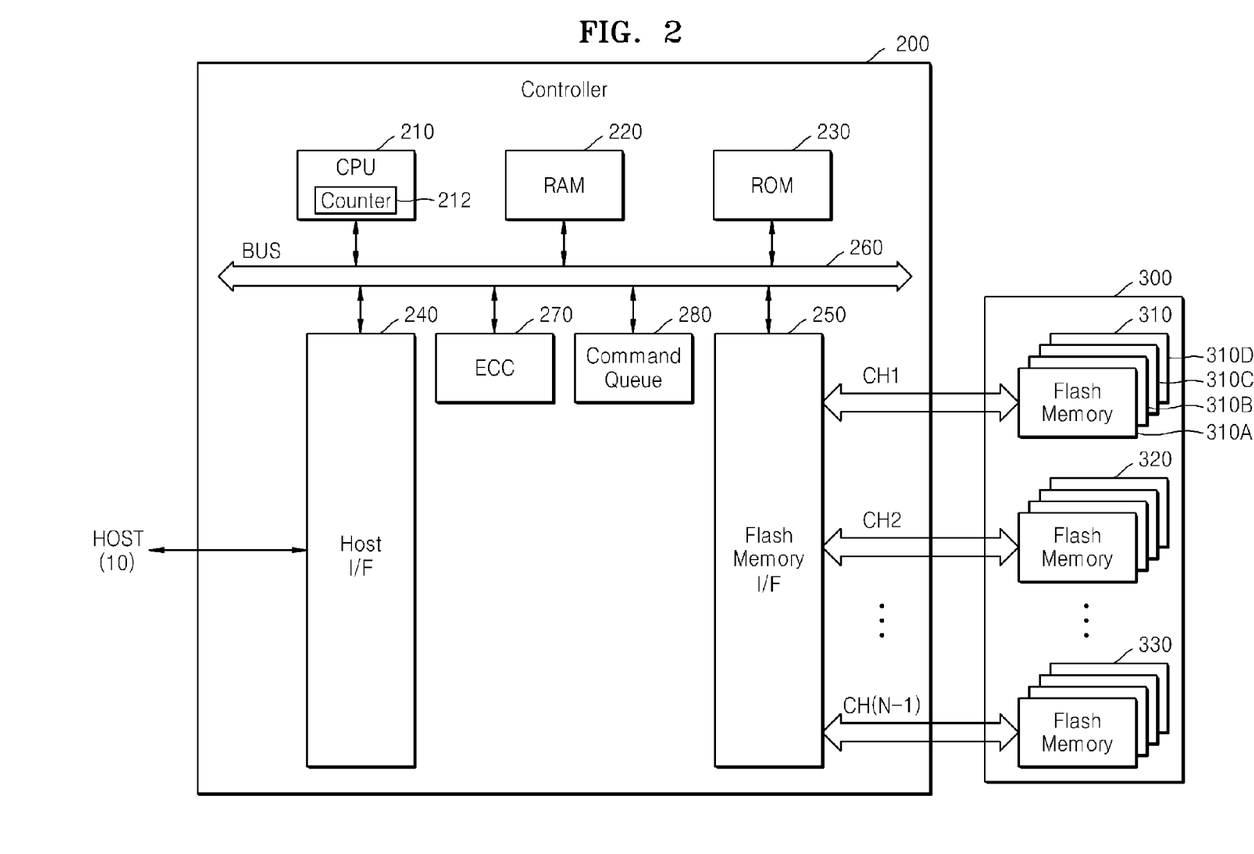
FIG. 2 is a block diagram of an example of a detailed construction of a controller shown in FIG. 1, according to an embodiment of the inventive concept.

FIG. 2 is a diagram of an example of a detailed construction of the controller 200 shown in FIG. 1, according to an embodiment of the inventive concept.

Referring to FIG. 2, the controller 200 includes a processor 210, random access memory (RAM) 220, read-only memory (ROM) 230, host interface 240, flash memory interface 250, a bus 260, an error correction circuit (ECC) 270, and a command queue 280. The processor 210, the RAM 220, the ROM 230, the host interface 240, the flash memory interface 250, the ECC 270, and the command queue 280 may be electrically connected to one another through the bus 260. The bus 260 may be a transmission line through which information is transmitted between components of the controller 200, for example. The processor 210 (e.g., a central processing unit (CPU)) controls overall operations of the memory system (refer to 100 in FIG. 1).

For example, the processor 210 may control the memory system 100 to decrypt a command received from the host 10 and perform an operation based on the decryption result.

Generally, the processor 210 provides a read command and an address to the flash memories 310 to 330 during a read operation, and provides a write command, an address, and write data to the flash memories 310 to 330 during a write operation. Also, the processor 210 may perform a process of converting a logical address received from the host 10 into a physical page address using metadata stored in the RAM 220.

During the erase operation, the processor 210 is configured to perform a memory control method to selectively continue, suspend, or cancel the erase operation. The erase operation may be performed in response to an erase command input from the host 10 or performed as a background operation for a merge operation, a garbage collection operation, or a refresh operation of the flash memories 310 to 330, for example. The processor 210 monitors the next command to be performed in the flash memories 310 to 330, which may be stored in the command queue 280. To determine an erase status, the processor 210 may include a counter 212 configured to count the number of clock cycles at a time point in which the erase operation starts. The processor 210 determines the erase status, and selectively continues, suspends, or cancels the erase operation based, at least in part, on the determination result of the erase status.

The processor 210 performs a process of converting a logical address, which may be received along with read/write commands from the host 10, into a physical address for enabling the flash memories 310 to 330 to perform read/write operations. The process of converting the logical address into the physical address may be performed in a flash translation layer (FTL), for example.

Data transmitted from the host 10 and data generated by the processor 210 may be temporarily stored in the RAM 220, and/or data read from the flash memories 310 to 330 may be temporarily stored in the RAM 220. Also, metadata read from the flash memories 310 to 330 may also be stored in the RAM 220. The metadata is management information generated by the memory system 100 to manage the flash memories 310 to 330. For example, the metadata may include mapping table information used to convert a logical address into a physical page address (PPA) of the flash memories 310 to 330. The metadata may also include information required to manage storage operations of the flash memories 310 to 330. The RAM 220 may be embodied by a dynamic random access memory (DRAM) or a static RAM (SRAM), for example, although other types of RAM may be incorporated without departing from the scope of the present teachings.

The ROM 230 is a read-only memory configured to store program(s) executed by the processor 210. A program for performing a memory control method to selectively continue, suspend, or cancel an erase operation of the flash memories 310 to 330, according to various embodiments, is stored in the ROM 230.

The host interface 240 may include a data exchange protocol between the host 10 and the processor 210. Various apparatuses may be connected as the host 10 to the host interface 240. The host 10 may be, for example, a digital image recording apparatus or a digital voice recording apparatus, although the host 10 is not limited to these devices.

The flash memory interface 250 is configured to control signals for driving the flash memories 310 to 330 and access the flash memories 310 to 330 in response to requests from the processor 210. The flash memory interface 250 may be configured such that software and hardware interleave operations may be selectively performed through multiple channels CH1 to CHN.

The ECC circuit 270 is configured to correct errors in data read from the flash memories 310 to 330. Error correction methods applied to the ECC circuit 270 may be divided into a hard decision (HD) method and a soft decision (SD) method. The HD method may correct errors in data using only data (hereinafter, HD data) read depending on on/off characteristics of a memory cell with application of a predetermined read voltage Vread and an error correction code. The SD method may correct errors in data using not only HD data and an error correction code but also additional information (hereinafter, reliability data) regarding reliability of HD data.

The command queue 280 is configured to store commands received from the host 10. For example, the command queue 280 may include three queues configured to respectively store a read command, a write command, and an erase command. Commands stored in the command queue 280 may be reordered to optimize performance during operations of the flash memories 310 to 330. For example, while an erase operation is being performed in response to an erase command, the processor 210 monitors the erase status and a next command stored in the command queue 280, and cancels, suspends or completes the erase operation in response. For example, the processor 210 may cancel the erase operation when it is soon after the erase operation has started, perform the next command stored in the command queue 280, and then re-start the erase operation from the beginning. When the erase operation has progressed for a predetermined time, the processor 210 may suspend the erase operation, perform the next command stored in the command queue 280, and then resume the erase command from the point of suspension. When it is soon before the erase operation is completed, the processor 210 may continue the erase operation until it is finished, and then perform the next command stored in the command queue 280. The meaning of "soon," as used in the phrases soon after the erase operation has started and soon before the erase operation is completed, is relative to the overall time required to perform the entire erase operation, as discussed further below. For example, "soon" may refer to a time period that is between about 1 percent and about 33 percent of the overall time required to perform the entire erase operation, although the relative times may vary to provide unique benefits for any particular situation or to meet application specific design requirements of various implementations, as would be apparent to one skilled in the art.

When power is supplied to the memory system 100, the processor 210 may control the memory system 100 to read metadata stored in the flash memories 310 to 330 and store the metadata in the RAM 220. The processor 210 may control the memory system 100 to update the metadata stored in the RAM 220 depending on an operation of enabling the flash memories 310 to 330 to change metadata. Also, the processor 210 may control the memory system 100 to write metadata stored in the RAM 220 to the flash memories 310 to 330 before the memory system 100 is powered off.

In the present embodiment, while the controller 200 is executing processing operations, the processor 210 may run a program stored in the RAM 220 or the ROM 230, and access the flash memories 310 to 330.

Figure 3:
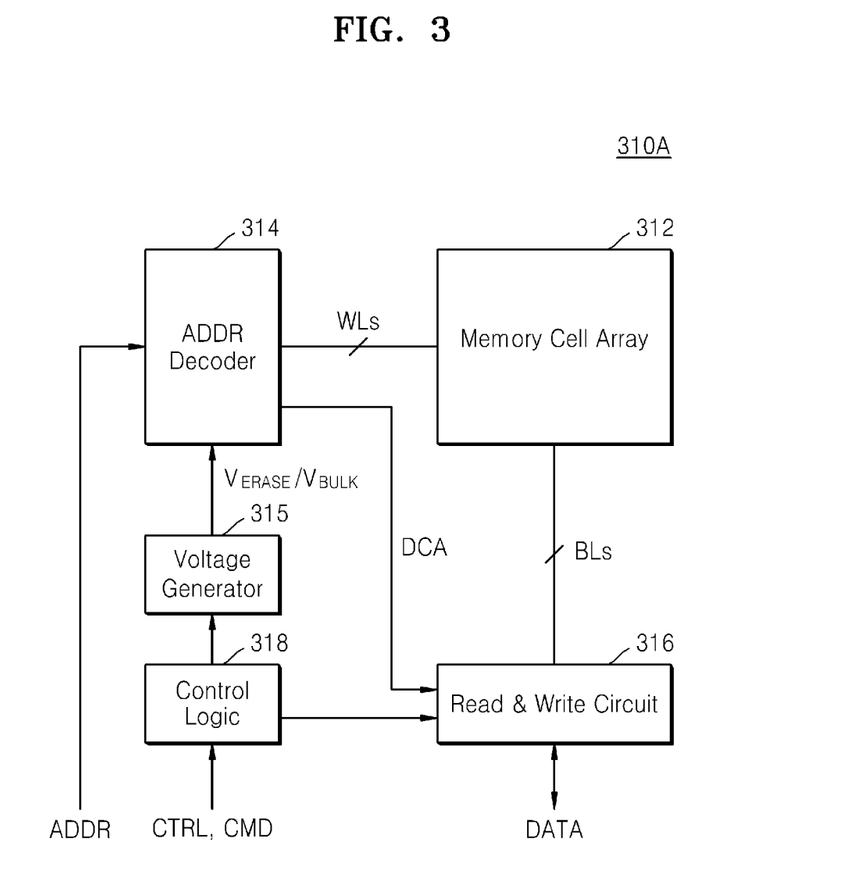
FIG. 3 is a block diagram of an example of a detailed construction of the flash memory shown in FIG. 1, according to an embodiment of the inventive concept.

FIG. 3 is a block diagram of an example of a detailed construction of the flash memory shown in FIG. 1, according to an embodiment of the inventive concept.

Referring to FIG. 3, flash memory 310A may be a NAND-type flash memory. The flash memory 310A includes a memory cell array 312, an address decoder 314, a read/write circuit 316, and control logic 318.

The memory cell array 312 is connected to the address decoder 314 through word lines WLs, and is connected to the read/write circuit 316 through bit lines BLs. The memory cell array 312 includes multiple memory cells. As an example, memory cells arranged in a row direction may be connected to the word lines WLs, and memory cells arranged in a column direction may be connected to the bit lines BLs. The memory cells arranged in the column direction may constitute multiple cell groups (e.g., strings), and the strings may be respectively connected to the bit lines BL. As an example, the memory cell array 312 may include multiple memory cells, each of which may store one or more bits.

Typical user data or main data may be stored in the memory cell array 312. In addition to the user data, metadata (e.g., mapping information of an FTL) required to drive the flash memory 310A may be stored in the memory cell array 312. The FTL is configured to efficiently operate the flash memory 310A. For example, the FTL may convert a logical address provided by the processor 210 into a physical address used in the flash memory.

The memory cell array 312 may include multiple memory blocks. In the memory cell array 312, an erase operation may be performed on multiple address units (MAUs), which are simultaneously erasable blocks among the multiple memory blocks.

The address decoder 314 is configured to decode a row address among received addresses ADDR. The row address includes block information for selecting a memory block and page address information for selecting pages (or word lines WLs) of a selected memory block. The address decoder 314 is configured to store block address information of a memory block to be erased under the control of the control logic 318 during an erase operation. The address decoder 314 drives word lines of a memory block, which is selected according to an operation mode, using a word line voltage generated by a voltage generator 315. The address decoder 314 may be configured to decode a column address among the received addresses ADDR. A decoded column address DCA may be transmitted to the read/write circuit 316. As an example, the address decoder 314 may include components, such as a row decoder, a column decoder, and an address buffer.

The voltage generator 315 is configured to generate word line voltages and a bulk voltage VBULK to be applied to multiple word lines WLs according to an operation mode. For instance, the voltage word lines may include a program voltage, a pass voltage, a read voltage, and an erase voltage VERASE. The voltage generator 315 is controlled by the control logic 318.

The read/write circuit 316 is configured to receive data from a data input/output (I/O) circuit and write the received data to the memory cell array 312. The read/write circuit 316 is further configured to read data from the memory cell array 312 and transmit the read data to the data I/O circuit. As an example, the read/write circuit 316 may include components, such as a page buffer (or a page register), a column selection circuit, and a data buffer. The page buffer may operate as a write driver configured to temporarily store data to be written to memory cells connected to a selected word line or operate as a sense amplifier configured to sense and amplify data read from the memory cells connected to the selected word line.

The control logic 318 is configured to control general operations related to write operations, read operations, and erase operations of the flash memory 310A. During an erase operation of the flash memory 310A, the control logic 318 may cancel the erase operation and perform the next command of the controller 200 when it is soon after the erase operation started. When the erase operation of the flash memory 310A has progressed for a predetermined time, the control logic 318 may suspend the erase operation and perform the next command of the controller 200. When it is soon before the flash memory 310A will finish the erase operation, the control logic 318 may continue the erase operation until it is finished, and then perform the next command of the controller 200.

Figure 4A:
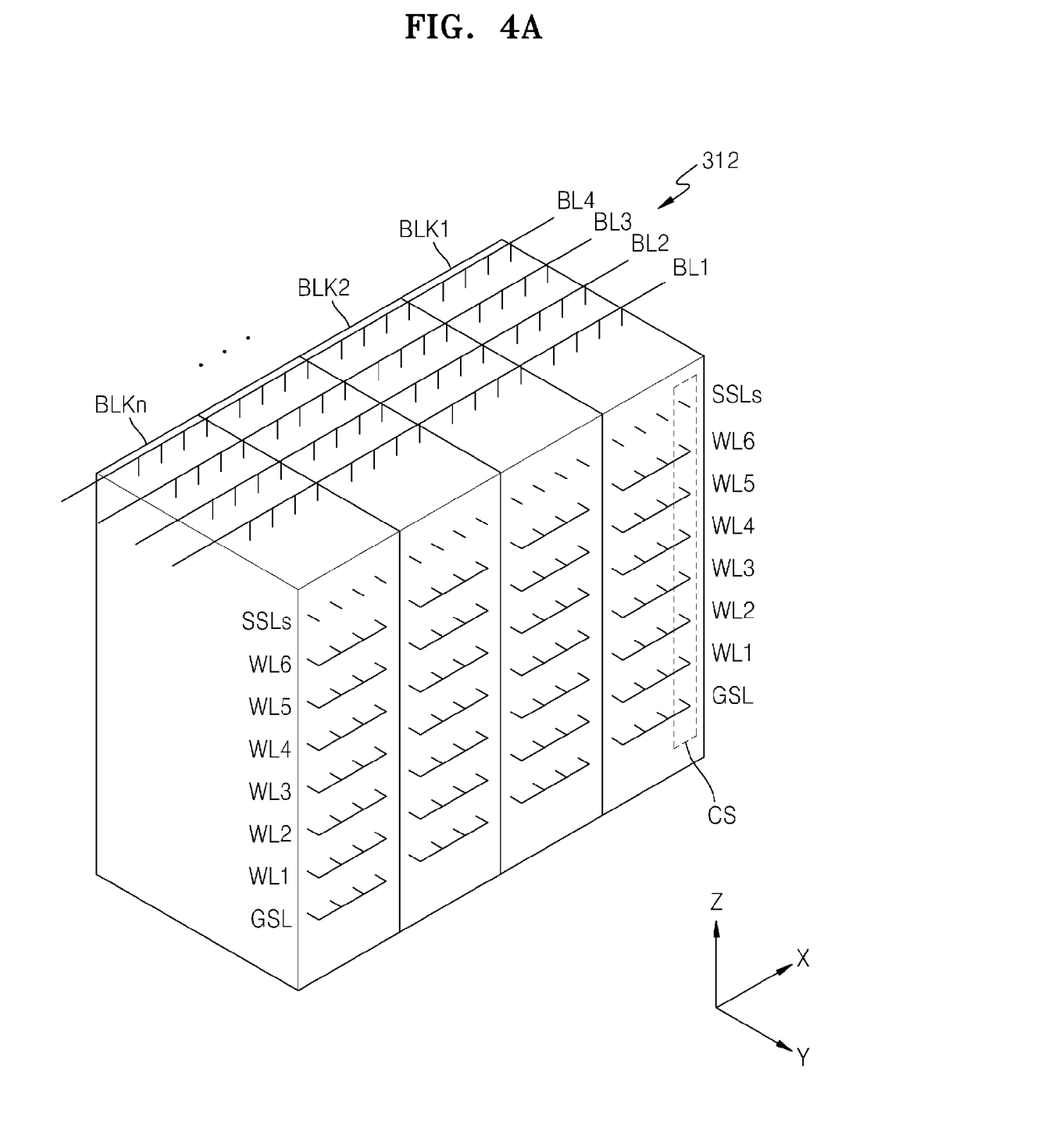
FIGS. 4A through 4C are diagrams illustrating a memory cell array of FIG. 3, according to an embodiment of the inventive concept.
Figure 4B:
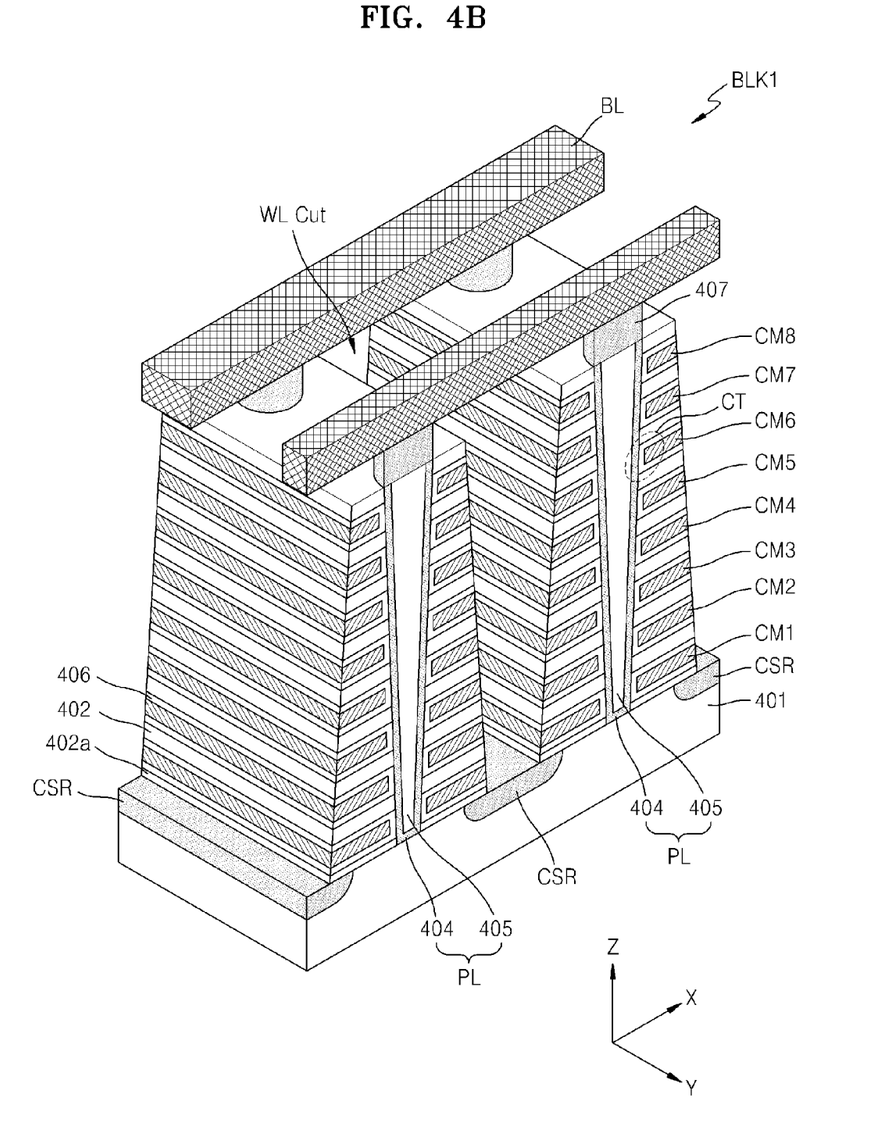
Figure 4C:
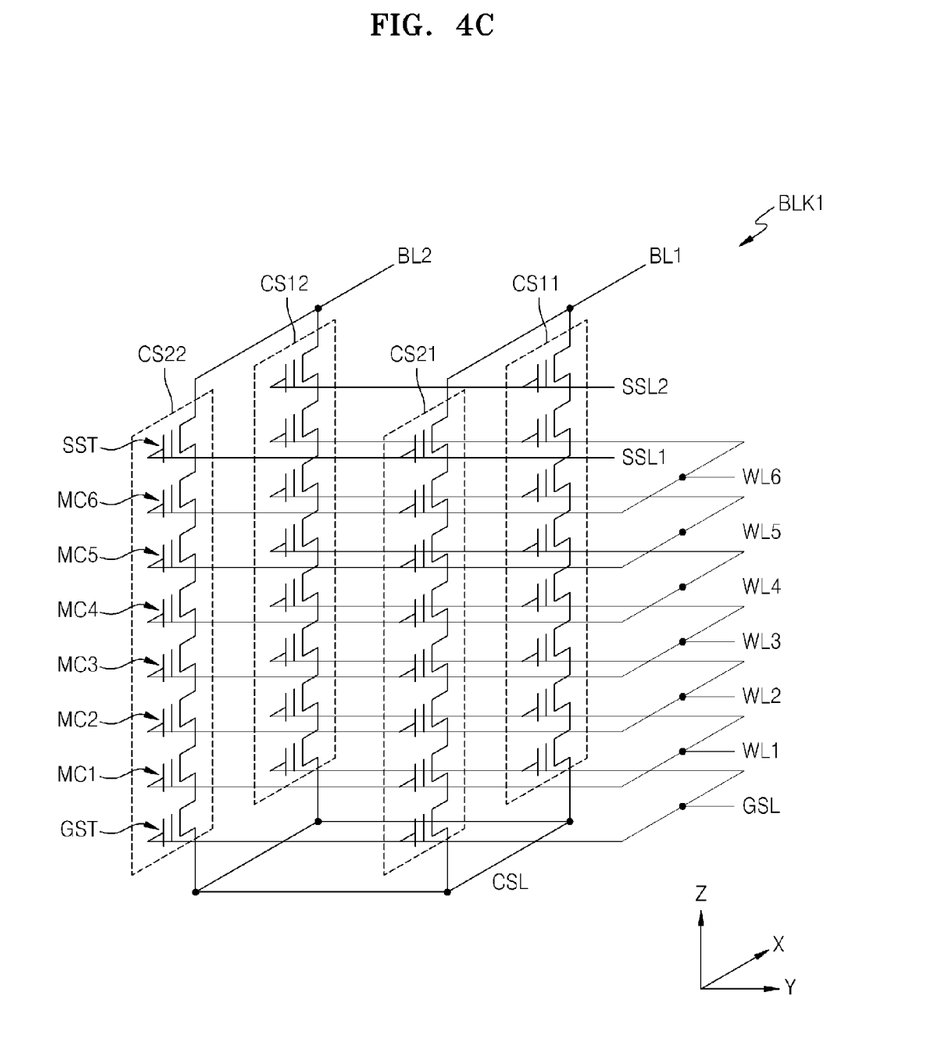

FIGS. 4A through 4C are diagrams of the memory cell array 312 of FIG. 3, according to an embodiment of the inventive concept.

Referring to FIG. 4A, the memory cell array 312 includes multiple memory blocks BLK1 to BLKn. Each of the memory blocks BLK1 to BLKn has a 3-dimensional structure (or vertical structure). For example, each of the memory blocks BLK1 to BLKn may include structures extending in first through third directions X, Y and Z. Each of the memory blocks BLK1 to BLKn includes multiple cell strings CSs extending in the third direction Z. In the depicted configuration, the cell strings CSs are spaced apart from one another in the first direction X and the second direction Y.

FIG. 4B is a perspective sectional view of a portion of a first block BLK1 of FIG. 4A, according to an embodiment of the inventive concept.

Referring to FIG. 4B, 3-dimensional structures extending in the first through third directions X, Y and Z are provided. A substrate 401 is provided, which may be a well of a first conductivity type, for example, such as a P conductivity type. Multiple common source regions CSR are the substrate 401. In the depicted configuration, the common source regions CSR extend along the second direction Y and are spaced apart from one another along the first direction X. The common source regions CSR are connected in common and constitute a common source line CSL. Also, the common source regions CSR may be of a second conductivity type different from the first conductivity type of the substrate 401. For example, the common source regions CSR may be of an N conductivity type.

Multiple insulating materials 402a and 402 may be sequentially provided on the substrate 401 between adjacent common source regions CSR in the third direction Z, which is a direction vertical to the substrate 401. In the depicted configuration, the insulating materials 402a and 402 are spaced apart from one another in the third direction Z and extend in the second direction Y. The insulating materials 402a and 402 may include an insulating material, such as a semiconductor oxide film. Among the insulating materials 402a and 402, the insulating material 402a, which may be in contact with the substrate 401, may have a smaller thickness than the other insulating material 402, for example.

Multiple pillars PL are provided between two adjacent common source regions CSR and spaced apart from one another along the first direction X. The pillars PL penetrate the insulating materials 402a and 402 along the third direction Z. The pillars PL are in contact with the substrate 401 through the insulating materials 402a and 402. The pillars PL include channel layers 404 and internal materials 405 disposed within the channel layers 404. The channel layers 404 may include a semiconductor material (e.g., silicon) of the first conductivity type, which is the same conductivity type as the substrate 401. The internal materials 405 may include an insulating material, such as a silicon oxide film.

Data storage layers 406 are provided on exposed surfaces of the insulating materials 402a and 402 and the pillars PL between two adjacent common source regions CSR. The data storage layers 406 may capture or emit charges and store information.

Conductive materials CM1 to CM8 are provided on exposed surfaces of the data storage layers 406 between two adjacent common source regions CSR and between the insulating materials 402a and 402. The conductive materials CM1 to CM8 extend in the second direction Y. The conductive materials CM1 to CM8 are separated by a WL cut on the common source regions CSR. The WL cut extends along the second direction Y and exposes the common source regions CSR. The conductive materials CM1 to CM8 may include a metallic conductive material. The conductive materials CM1 to CM8 may include a nonmetallic conductive material, such as polysilicon (poly-Si), for example. The conductive materials CM1 to CM8 may have first through eighth heights in sequential order from the substrate 401.

Multiple drains 407 are provided on the pillars PL. The drains 407 may include a semiconductor material (e.g., silicon) of the second conductivity type. The drains 407 expand onto the channel layers 404. Bit lines BL are provided on the drains 407. In the depicted configuration, the bit lines BL extend in the first direction X and are spaced apart from one another in the second direction Y. The bit lines BL are connected to the drains 407. For example, the drains 407 may be connected to the bit lines BL through contact plugs. The bit lines BL may include a metallic conductive material and/or a nonmetallic conductive material, such as poly-Si, for example.

The pillars PL form multiple cell strings along with the data storage layers 406 and the conductive materials CM1 to CM8. Each of the cell strings include multiple cell transistors stacked in a direction vertical to the substrate 401. The cell transistors CT may include the conductive materials CM1 to CM8, the pillars PL, and the data storage layer 406 provided between the conductive materials CM1 to CM8 and the pillars PL.

The conductive materials CM1 to CM8 may operate as gates (or control gates) of the cell transistors CT. As an example, first conductive materials CM1 may constitute ground selection transistors GST along with the data storage layers 406 and the pillars PL. The first conductive materials CM1 may be connected to one another and constitute a single ground selection line GSL, which is commonly connected. Second through seventh conductive materials CM2 to CM7 may constitute first through sixth memory cells MC1 to MC6 along with the data storage layers 406 and the pillars PL. The second through seventh conductive materials CM2 to CM7 may constitute first through sixth word lines WL1 to WL6. Eighth conductive materials CM8 may constitute string selection transistors CST along with the data storage layers 406 and the pillars PL. The eighth conductive materials CM8 may constitute string selection lines SSL1 and SSL2.

FIG. 4C is an equivalent circuit corresponding to a portion of the first block BLK1 of FIG. 4B.

Referring to FIG. 4C, cell strings CS11, CS12, CS21, and CS22 are provided between bit lines BL1 and BL2 and the common source line CSL. The cell strings CS11, CS12, CS21, and CS22 include a string selection transistor SST connected to a string selection line SSL, multiple memory cells MC1 to MC6 connected respectively to multiple word lines WL1 to WL6, and a ground selection transistor GST connected to the ground selection line GSL.

Memory cells at the same level (or height) are connected in common to one word line. Accordingly, when a voltage is supplied to a word line at a particular level, the voltage is applied to all cell strings CS11, CS12, CS21, and CS22.

Cell strings CS11, CS12, CS21, and CS22 disposed in different rows are respectively connected to different string selection lines SSL1 and SSL2. First and second string selection lines SSL1 and SSL2 may be selected and unselected so that the cell strings CS11, CS12, CS21, and CS22 can be selected and unselected in row units.

In the depicted configuration, the cell strings CS11, CS12, CS21, and CS22 are be connected to the bit lines BL1 and BL2 in column units. The cell strings CS11 and CS21 are connected between a first bit line BL1 and the common source line CSL, and cell strings CS12 and CS22 are connected between a second bit line BL2 and the common source line CSL. The bit lines BL1 and BL2 may be selected and unselected so that the cell strings CS11, CS12, CS21, and CS22 can be selected and unselected in column units.

To write data to the multiple memory cells MC1 to MC6, to begin, an erase operation is performed such that the memory cells MC1 to MC6 have a predetermined negative threshold voltage. The erase operation may be performed in units of blocks BLK1 to BLKn. Thereafter, a high voltage Vpgm is applied to a word line connected to a selected memory cell for a predetermined time so that a write operation can be performed on the selected memory cell. During a data read operation, a voltage of about 0V is applied to a gate of a selected memory cell transistor, and a power supply voltage VCC is applied to a gate of an unselected memory cell transistor.

In a flash memory having not only a 3-dimensional memory cell array according to the present embodiment, but also a planar memory cell array, an erase operation may take a much longer time to complete than a write operation and a read operation. To reduce the erase time, according to embodiments of the present inventive concept, an address mapping method is used to simultaneously erase multiple memory blocks BLK1 to BLKn based on an MAU.

Figure 5:
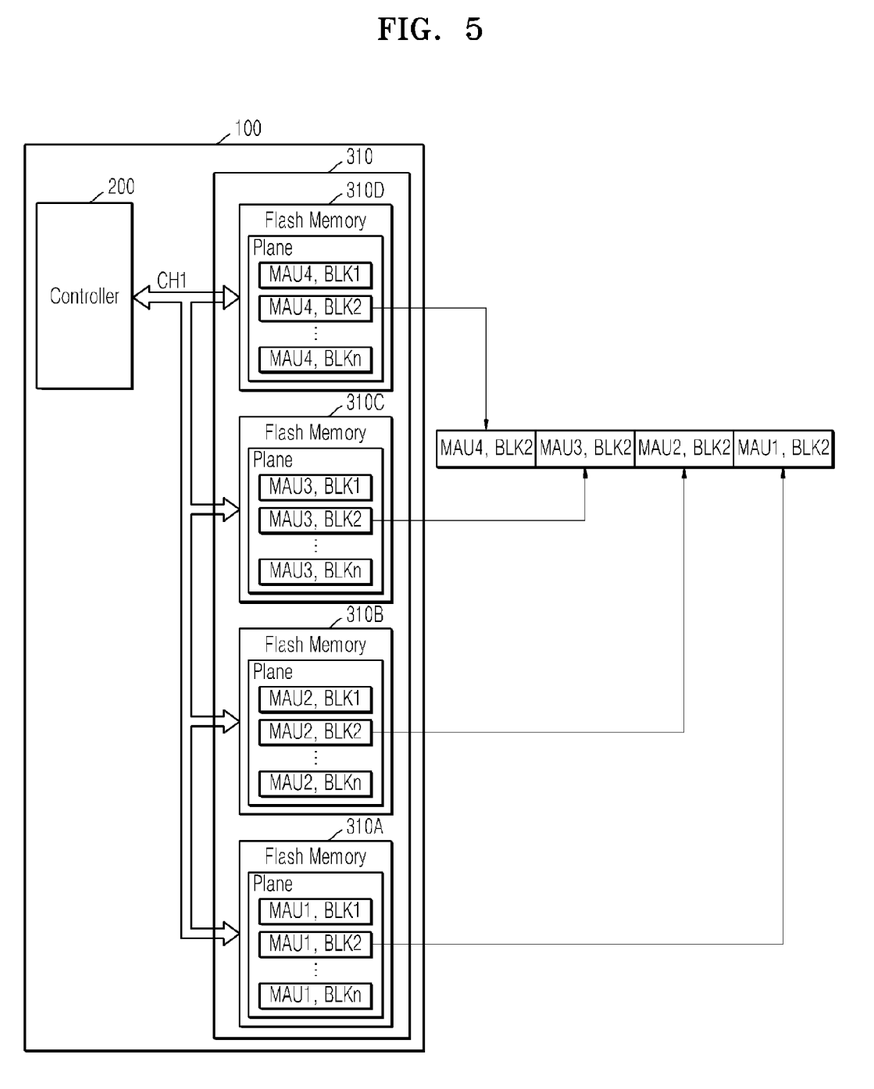
FIG. 5 is a diagram illustrating an address mapping scheme of the memory system of FIG. 1, according to an embodiment of the inventive concept.

FIG. 5 is a block diagram illustrating an address mapping scheme of the memory system 100 of FIG. 1, according to an embodiment of the inventive concept. Each of the flash memories 310 to 330 of the memory system 100 of FIG. 1 includes a memory cell array including multiple memory blocks BLK1 to BLKn, and read, erase, and write operations of the respective memory blocks BLK1 to BLKn may be independently performed. In particular, the time taken to erase the memory blocks BLK1 to BLKn may restrict not only performance of the flash memories 310 to 330, but also performance of the memory system 100. To solve these drawbacks, MAUs are used for an address mapping method to simultaneously erase multiple blocks BLK1 to BLKn.

Referring to FIG. 5, an address mapping operation may be enabled by MAUs. An MAU refers to physical storage to which a read operation, a write operation, or an erase operation is accessible simultaneously or in parallel from one channel. The MAU may be a single die, for example. In some embodiments, when a single die includes multiple planes, the MAU may be a single plane.

Each of four flash memory dies 310A to 310D connected to one channel, for example, the first channel CH1, may have one plane. The flash memory dies 310A to 310D may be discriminated by MAU numbers. For example, the flash memory dies 310A to 310D may be indicated by MAU1 to MAU4, respectively. MAUs MAU1 to MAU4 may include the same number of memory blocks BLK1 to BLKn. The size of an MAU is defined by the number of erasable blocks. MAUs may have arrays of four memory blocks, for example, memory blocks BLK1 included in the respective MAUs MAU1 to MAU4, memory blocks BLK2 included in the respective MAUs MAU1 to MAU4, and memory blocks BLKn included in the respective MAUs MAU1 to MAU4. The memory system 100 having the address mapping scheme including the MAUs may receive an erase command from the host 10.

Methods of controlling a flash memory in connection with erase/continuation/suspension/cancellation operations to reduce a latency caused by an erase operation of the flash memory are described below, according to embodiments of the inventive concept. The methods may be embodied by a program for controlling a flash memory using the controller 200 of FIG. 2 or firmware (F/W) on which such a program is recorded.

Figure 6:
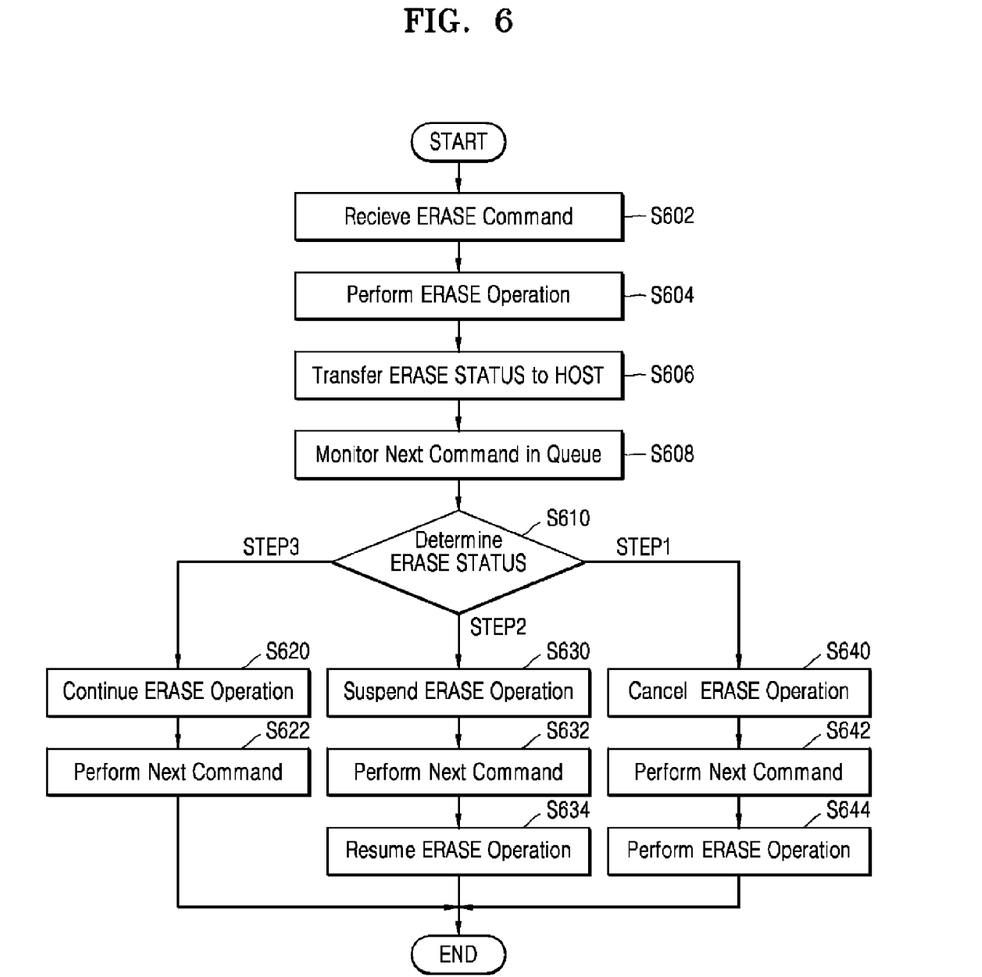
FIG. 6 is a flowchart illustrating a method of controlling a flash memory, according to an embodiment of the inventive concept.

FIG. 6 is a flowchart illustrating a method of controlling a flash memory, according to an embodiment of the present inventive concept.

In operation S602, a controller 200 receives an erase command ERASE from a host (e.g., host 10 in FIG. 1). The controller 200 also receives an address of a memory block to be erased along with the erase command ERASE.

In operation S604, the controller 200 begins performance of an erase operation on the flash memory in response to the erase command ERASE. During the erase operation, the voltage generator (e.g., voltage generator 315 in FIG. 3) of the flash memory on which the erase operation is to be performed generates a bulk voltage VBULK as a high voltage (e.g., about 20V), which will be provided to a bulk of a selected memory block, and an erase voltage VERASE (e.g., 0V), which will be provided to word lines WLs of the selected memory block, under the control of control logic (e.g., control logic 318 in FIG. 3).

Alternative to the erase command ERASE, the erase operation may be performed as a background operation for a merge operation, a garbage collection operation, or a refresh operation, for example. When data stored in the flash memories 310 to 330 is no longer useful (e.g., obsolete, dirty or invalid), the erase operation may be performed during the garbage collection operation. A refresh operation refers to a data backup operation. The refresh operation includes reading data stored in a specific memory block and writing read data in another memory block. The refresh operation may further include erasing the specific memory block in which backed-up data is stored.

The erase operation may be performed during an erase time (e.g., given to the erase command ERASE).

Figure 7:
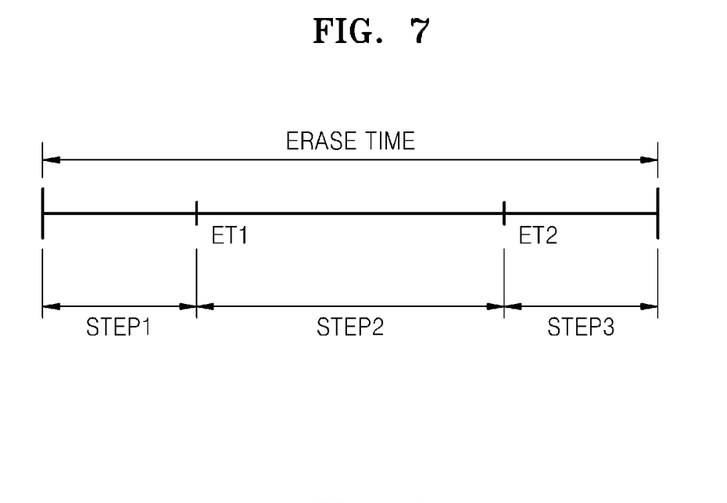
FIG. 7 is a diagram illustrating an erase time in the method of controlling the flash memory, which is illustrated in FIG. 6, according to an embodiment of the inventive concept.

In Operation S606, the controller 200 transfers an erase status to the host (e.g., host 10 in FIG. 1). As shown in FIG. 7, the erase time may include a sequence of three steps, first step STEP1, second step STEP2, and third step STEP3. The first step STEP1 is set between first time point ET1 and second time point ET2, the second step STEP1 is set between the second time point ET2 and third time point ET2, and the third step STEP3 is set after the second time point ET2 (to the end of the erase operation).

The first time point ET1 refers to a time occurring soon after the erase operation has started (and Operation S604), and the second time point ET2 refers to a time occurring soon before the erase operation is finished. For example, assuming that the entire erase operation takes about 10 ms, the first time point ET1 may be set at a time duration of about 2.5 ms after the erase operation started, and the second time point ET2 may be set at a time point of about 7.5 ms after the erase operation started (that is, about 2.5 ms before the erase operation ends). Generalizing the example, the first time point ET1 may be set at a time duration of about one fourth the total erase time, and the second time point ET2 may be set at a time duration of about three fourths of the total erase time (i.e., about one fourth of the total erase time from the end of the erase operation). Or, stated differently, the first time point ET1 is set at a time duration before a half way point of the total erase time, and the second time point ET2 is set at a time after the half way point of the total erase time. Of course, other time durations corresponding to the first and second time points ET1 and ET2 may be incorporated without departing from the scope of the present teachings.

The duration of the erase operation (and the respective durations corresponding to the first time point ET1 and the second time point ET2) may be determined by counting the number of clock cycles in the processor 210 of the controller 200 from the time point at which the erase operation starts. In some embodiments, the erase time may include multiple step sequences greater or less than the three step sequences shown in FIG. 7.

In Operation S608, the controller 200 monitors the next command stored in the command queue (e.g., command queue 280 in FIG. 2).

In Operation S610, the controller 200 determines an erase status of the ongoing erase operation. In an embodiment, the erase status corresponds to one of the first step STEP1, the second step STEP2, and the third step STEP3, discussed above. In other words, the erase status may correspond to the amount of time that has elapsed since performance of the erase operation began (in Operation S604).

In Operations S620 and S622, when it is determined in operation S610 that it is soon before the erase operation is finished, the erase operation continues (operation S620). For example, when the erase status indicates the third step STEP3, the erase operation is continued and finished, and the next command stored in the command queue 280 is performed (operation S622).

In Operations S630, S632, and S634, when it is determined in operation S610 that the erase operation has been performed for a predetermined time, the erase operation is suspended (operation S630). For example, when the erase status indicates the second step STEP2, the erase operation is suspended, and the next command stored in the command queue 280 is performed (operation S632), while the erase operation remains suspended. After the next command is performed, performance of the suspended erase operation resumes (operation S634).

In Operations S640, S642, and S644, when it is determined in operation S610 that it is soon after the erase operation has started, the erase operation is canceled (operation S640). For example, when the erase status indicates the first step STEP1, the erase operation is canceled, and the next command stored in the command queue 280 is performed (operation S642). After the next command is performed, performance of the canceled erase operation is performed from the beginning or re-started (operation S644).

The method of controlling the flash memory according to the present embodiment may include counting the clock number at a time point at which each of the flash memories 310 to 330 starts an erase operation, and determining an erase status. The erase operation is therefore selectively continued, suspended, or canceled based on the determination result. The next command may then be performed before completion of the erase operation, when determination of the erase status results in suspension or cancelation of the erase operation. The host can therefore avoid waiting long periods of time until the erase operation is finished, and enable it to perform other commands. Thus, the host may reduce a latency caused by the erase operation of the flash memory.

Figure 8:
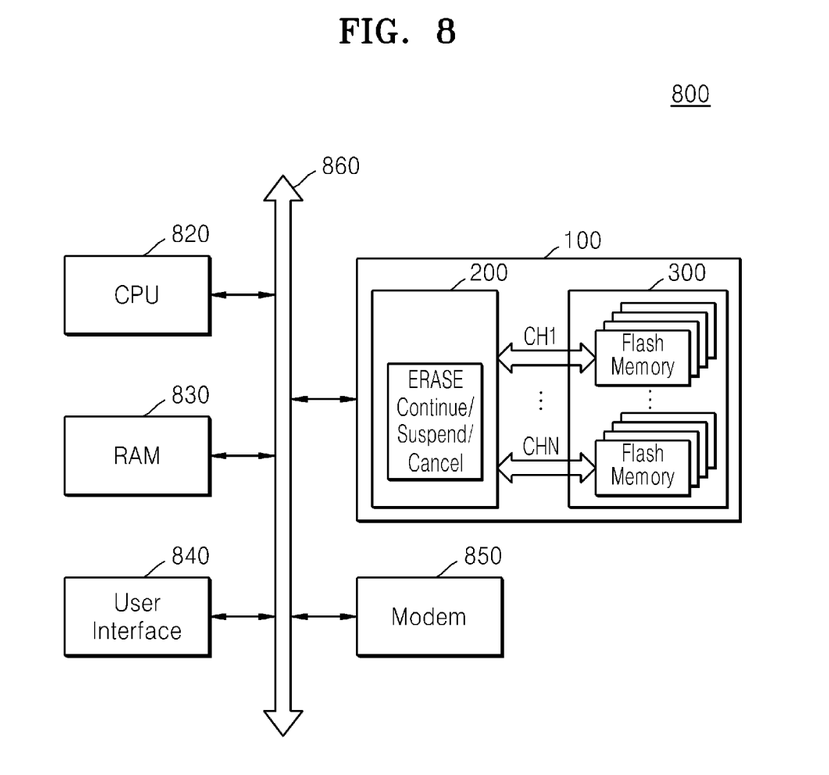
FIG. 8 is a diagram illustrating a computing system adopting a method of controlling a flash memory, according to embodiments of the inventive concept.

FIG. 8 is a diagram illustrating a computing system 800 adopting a method of controlling a flash memory, according to various embodiments of the inventive concept.

Referring to FIG. 8, the computing system 800 includes a microprocessor (MP) or CPU 820, a RAM 830, a user interface 840, a modem 850 such as a baseband chipset, and a memory system 100, all of which are electrically connected to a system bus 860.

The memory system 100 includes a controller 200 and a flash memory 300. The controller 200 connects the MP 820 with the flash memory 300 through the system bus 860. The controller 200 may correspond to a bus format of the MP 820 and interface with the flash memory 300. The memory system 100 may constitute a solid-state disk (SSD), for example. In this case, the controller 200 may communicate with the outside (e.g., a host) through one of various interface protocols, such as a universal serial bus (USB), a multimedia card (MMC), peripheral component interface-express (PCI-E), serial attached SCSI (SAS), serial advanced technology attachment (SATA), parallel-ATA (PATA), a small computer system interface (SCSI), an enhanced small device interface (ESDI), and an intelligent drive electronics (IDE), for example.

The controller 200 may have the same configuration as the controller 200 shown in FIG. 2. Also, the controller 200 is configured to adopt methods of controlling a flash memory according to various embodiments of the inventive concept. The flash memory 300 may have the same configuration as the flash memory shown in FIGS. 3 and 4A through 4C.

As discussed above, the controller 200 receives an erase command from the host and enables an erase operation of the flash memory 300. The controller 200 monitors the next command to be performed in the flash memory 300, and determines an erase status. The controller 200 selectively continues, suspends, or cancels the erase operation based on the determination result. When it is soon after the erase operation started, the controller 200 cancels the erase operation, performs the next command, and re-starts the erase operation upon completion of the next command. When the erase operation has been performed for a predetermined time, the controller 200 suspends the erase operation, performs the next command, and resumes the erase operation upon completion of the next command. When it is soon before the erase operation is finished, the controller 200 continues the erase operation, completes the erase operation, and then performs the next command.

When the computing system 800 is a mobile device, a battery (not shown) for supplying an operating voltage of the computing system 800 may be further provided. Also, an application chipset, a camera image processor (CIS), and a mobile DRAM (not shown) may be further provided to the computing system 800.

The controller 200 and/or the flash memory 300 according to various embodiments may be mounted using packages with various shapes. For example, the controller 200 and/or the flash memory 300 may be packaged using a Package on Package (PoP) technique, a ball grid array (BGA) technique, a chip-scale package (CSP) technique, a plastic-leaded chip carrier (PLCC) technique, a plastic dual in-line package (PDIP) technique, a die-in-waffle-pack technique, a die-in-wafer-form technique, a chip-on-board (COB) technique, a ceramic dual in-line package(CERDIP) technique, a plastic metric quad flat pack (MQFP) technique, a thin quad flat-pack (TQFP) technique, a small outline (SOIC) technique, a shrink small outline package (SSOP) technique, a thin small outline (TSOP) technique, a thin quad flatpack (TQFP) technique, a system-in-package (SIP) technique, a multi-chip package (MCP) technique, a wafer-level fabricated package (WFP) technique, or a wafer-level processed stack package (WSP) technique.

The above-described embodiments of the present inventive concept may be embodied not only by a system and a method, but also by a program, executable by a computer processor, for enabling performance of corresponding functions according to the embodiments of the inventive concept, or a recording medium configured to store the program. This would be apparent to those of ordinary skill in the art based on the above descriptions of the embodiments.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A method, executed by a memory controller, of controlling an erase operation of a non-volatile memory, the method comprising:
    beginning performance of the erase operation;
    monitoring for an existence of a next command, received from an external host device, to be performed in the non-volatile memory while performing the erase operation;
    determining an erase status of the erase operation; and
    selectively continuing, suspending, or canceling the erase operation based on the determination result of the erase status and the existence of the next command.

2. The method of claim 1, further comprising completing the erase operation and executing the next command, based on the determination result.

3. The method of claim 1, further comprising suspending the erase operation, executing the next command, and then resuming the erase operation, based on the determination result.

4. The method of claim 1, further comprising canceling the erase operation, executing the next command, and then re-starting the erase operation, based on the determination result.

5. The method of claim 1, further comprising:
    determining the number of clock cycles executed by a clock during the performance of the erase operation, wherein
    the erase status is determined according to a step to which the counted number of clock cycles belongs among first through third steps of the erase operation.

6. The method of claim 5, wherein:
    the first step exists before a first time point of the erase operation, the second step exists between the first time point and a second time point of the erase operation, and the third step exists after the second time point, and
    the first time point corresponds to a time point soon after the erase operation begins, and the second time point corresponds to a time point soon before the erase operation is completed.

7. The method of claim 1, wherein the monitoring of the existence of the next command comprises monitoring for the existence of the next command within a command queue of the memory controller.

8. The method of claim 1, wherein the erase operation is performed in response to an erase command.

9. The method of claim 1, wherein the erase operation is performed as a background operation for a merge operation, a garbage collection operation, or a refresh operation of the non-volatile memory.

10. The method of claim 1, wherein the erase operation is performed on multiple address units (MAUs), which are simultaneously erasable blocks among a plurality of memory blocks of the non-volatile memory.

11. A memory system comprising:
    a non-volatile memory; and
    a controller configured to:
        begin performing an erase operation on the non-volatile memory,
        monitor for an existence of a next command, received from an external host device, to be performed in the non-volatile memory while performing the erase operation,
        determine an erase status of the erase operation, and
        selectively continue, suspend, or cancel the erase operation based on the determination result and the existence of the next command.

12. The memory system of claim 11, wherein the controller determines the number of clock cycles executed by a clock during the erase operation, and determines the erase status according to a step to which the counted number of clock cycles belongs among first through third steps of the erase operation.

13. The memory system of claim 12, wherein:
    the first step exists prior to a first time point of the erase operation, the second step exists between the first time point and a second time point of the erase operation, and the third step exists after the second time point, and
    the first time point corresponds to a time point soon after the erase operation begins, and the second time point corresponds to a time point soon before the erase operation is completed.

14. The memory system of claim 11, wherein the controller is configured to perform the erase operation in response to an erase command.

15. The memory system of claim 11, wherein the controller is configured to perform the erase operation in response to an erase command, and as a background operation for a merge operation, a garbage collection operation, or a refresh operation of the non-volatile memory.

16. The memory system of claim 11, wherein the non-volatile memory performs the erase operation on multiple address units (MAUs), which are simultaneously erasable blocks among a plurality of memory blocks.

17. A memory system comprising:
    a data storage unit comprising a plurality of sets of flash memories, each set of flash memories being connected to a channel of a plurality of channels corresponding to the sets of flash memories; and
    a controller configured to:
    begin performing an erase operation on at least one flash memory of one set of flash memories via a corresponding channel,
    monitor for an existence of a next command, received from an external host device, to be performed in the at least one flash memory while performing the erase operation, determine an erase status of the erase operation, and selectively continue, suspend, or cancel the erase operation based on the determined erase status and the existence of the next command.

18. The memory system of claim 17, wherein the controller begins performing the erase operation on a multiple address unit (MAU), which comprises simultaneously erasable blocks from among the at least one flash memory of the set of flash memories.

19. The memory system of claim 18, wherein the MAU is one of a single die or a single plane of a single die comprising multiple planes.

20. The memory system of claim 17, wherein the controller comprises a flash memory interface connected to the plurality of sets of flash memories via the plurality of channels, respectively, for enabling communication between the controller and the plurality of sets of flash memories, and a host interface for enabling communication between the controller and a host.

\* \* \* \* \*